(12) United States Patent
Solheim et al.

(10) Patent No.: US 6,381,384 B2
(45) Date of Patent: *Apr. 30, 2002

(54) FLEXIBLE WDM NETWORK ARCHITECTURE

(75) Inventors: Alan Glen Solheim, Kanata; Azmina Somani, Nepean, both of (CA); Robert W Spagnoletti, Hertford (GB)

(73) Assignee: Nortel Networks Limited, St-Laurent (CA)

( * ) Notice: Subject to any disclaimer, the term of this patent is extended or adjusted under 35 U.S.C. 154(b) by 0 days.

This patent is subject to a terminal disclaimer.

(21) Appl. No.: 09/741,337

(22) Filed: Dec. 21, 2000

Related U.S. Application Data

(63) Continuation of application No. 09/324,124, filed on Jun. 2, 1999, now Pat. No. 6,192,173.

(51) Int. Cl.$^7$ ................................................. G02B 6/28
(52) U.S. Cl. ............................ 385/24; 385/16; 385/46; 359/119; 359/124
(58) Field of Search ............................. 385/16, 24, 31, 385/37, 46, 47, 48; 359/117, 119, 110, 124, 125, 127, 128

(56) References Cited

U.S. PATENT DOCUMENTS 6,192,173 B1 * 2/2001 Solheim et al. ............... 385/24

* cited by examiner

*Primary Examiner*—Phan T. H. Palmer

(57) ABSTRACT

A unidirectional or bidirectional node for use in an optical communications network, a network consisting of such nodes. The node comprises one or more optical couplers as well as either or both of drop circuitry connected to an output port and add circuitry connected to an input port. This allows for changes to the wavelength plan without interruption of the ring traffic. If add circuitry is used, the wavelengths in the filtered add signal should be distinct from those of the incoming signal on the main optical path which is merged with the add signal. When separate fibers are used for transmitting and receiving data between a hub and nodes in a ring, the through loss of the couplers is reduced for upstream couplers, which increases the available loss to be assigned to the fiber.

25 Claims, 10 Drawing Sheets

FLEXIBLE WDM NETWORK ARCHITECTURE

The present application is a continuation of application Ser. No. 09/324,124 now U.S. Pat. No. 6,192,173, filed Jun. 2, 1999 and hereby incorporated by reference herein.

FIELD OF THE INVENTION

The present invention relates to fiber optic networks and particularly to WDM optical networks which require continued usage of the main fiber path while the wavelength plan is changed.

BACKGROUND OF THE INVENTION

The public's increasing demand for bandwidth has contributed to an acceleration in the development of wavelength division multiplexing (WDM) technology. Using WDM, data can be transmitted at a high rate on each of several wavelengths of light sharing an optical fiber. Currently, systems exist in which a single fiber carries over 100 Gb/s of data using 40 or more wavelengths.

Because of the large number of wavelengths and the high data rates involved, it becomes increasingly necessary to find a more flexible way of accessing individual wavelengths of light (optical channels) for purposes of reception at, or transmission from, a given node of a WDM network. Conventionally, individual optical channels may be "dropped" by inserting a filter in the main fiber path which reflects the desired wavelength towards equipment connected to the node where opto-electronic conversion and other processing may take place. Similarly, the addition of an optical channel is typically achieved by the insertion of a filter in the main fiber path, which filter transfers light arriving at the node at a desired wavelength back into the main optical path. When multiple wavelengths are to be dropped or added, multiple optical filters must be inserted in the main optical path at the location of the node.

Since the optical add and drop filters are tuned to specific wavelengths and intercept the optical flow along the main fiber path, it is crucial to provision a conventional WDM network with the correct number, location and operational wavelength of filters upon initial installation. Conventional WDM network architectures are therefore subject to eventual fiber interruptions and to the eventual addition or replacement of equipment in order to keep pace with the evolution of the network and that of the WDM technology used to transmit data through the network.

Given the high data rates involved, any disruption of the main fiber path leads to severe inconveniences for the operator and users of the network, while the operator is further burdened with the cost of adding or replacing equipment. Clearly, what is needed is a network architecture which satisfies current operational requirements while being sufficiently flexible to accommodate evolutionary changes in the network and in the wavelength plan.

SUMMARY OF THE INVENTION

According to a first broad aspect, the invention may be summarized as an optical communications node, including an optical coupling device having a first input port and a plurality of output ports and a drop circuit connected to at least one of the output ports. Each drop circuit is arranged to isolate a portion of the optical frequency spectrum of the optical signal present at the output port to which that drop circuit is connected.

The invention may be summarized according to a second broad aspect as a node for use in an optical communications network, including an optical coupling device having a plurality of input ports and an output port and an add circuit connected to at least one of the input ports, for admitting a signal occupying a selected portion of the optical frequency spectrum.

According to a third broad aspect, the invention may be summarized as a bidirectional node for use in an optical communications network, including an optical coupling device having a plurality of bidirectional first ports and a plurality of bidirectional second ports and a bidirectional optical filtering circuit connected to at least one of the first ports. At least another one of the first ports and at least one of the second ports are connectable to a main optical path, while the wavelengths of optical signals coupled to the main optical path by the filtering circuit and the optical coupling device are selected to be substantially non-interfering with respect to wavelengths occupied by optical signals arriving at the node along the main optical path.

The invention may also be summarized broadly as a node for use in a fiber optic network, including a broadband optical coupler having at least one input port and a plurality of output ports, the coupler being characterized by a through loss $L_{THROUGH}$. The node also has a unit for measuring the optical power $P_{IN\_CURRENT}$ of a multi-channel optical signal present at said input port of said coupler, an amplification unit for amplifying said multi-channel optical signal in accordance with a gain and a processing unit connected to the amplification unit. The processing unit is operable to receive control information comprising at least the output power level $P_{OUT\_PREV}$ of a previous node in the network and to set said gain equal to a function of $P_{OUT\_PREV}$, $P_{IN\_CURRENT}$, $L_{THROUGH}$ and a local target power level $T_{LOCAL}$.

According to yet another broad aspect, the invention may be summarized as a node for connection between first and second adjacent nodes in a main optical traffic-carrying path. The node includes a plurality of first ports and a plurality of second ports, at least one of the first ports being connectable to the first adjacent node and at least one of the second ports being connectable to the second adjacent node. The node also includes an optical coupling device arranged such that light entering any of the first ports is coupled to each of the second ports and light entering any of the second ports is coupled to each of the first ports, as well as removable filtering circuits connected to at least one of the first ports not connected to the first adjacent node and at least one of the second ports not connected to the second adjacent node. The filtering circuits are adapted to add or drop specified wavelength channels to or from the main optical path.

Due of the use of broadband couplers in the various nodes, this method advantageously allows accurate control of the loss around the ring, as the through loss of the couplers is generally known at each node.

The invention also extends to nodes equipped with power measurement devices and processors operable to execute the above described method.

BRIEF DESCRIPTION OF THE DRAWINGS

These and other aspects and features of the present invention will become apparent to those of ordinary skill in the art upon review of the following description of specific embodiments of the invention in conjunction with the accompanying drawings, in which.

DETAILED DESCRIPTION OF THE PREFERRED EMBODIMENTS

Figure 1:
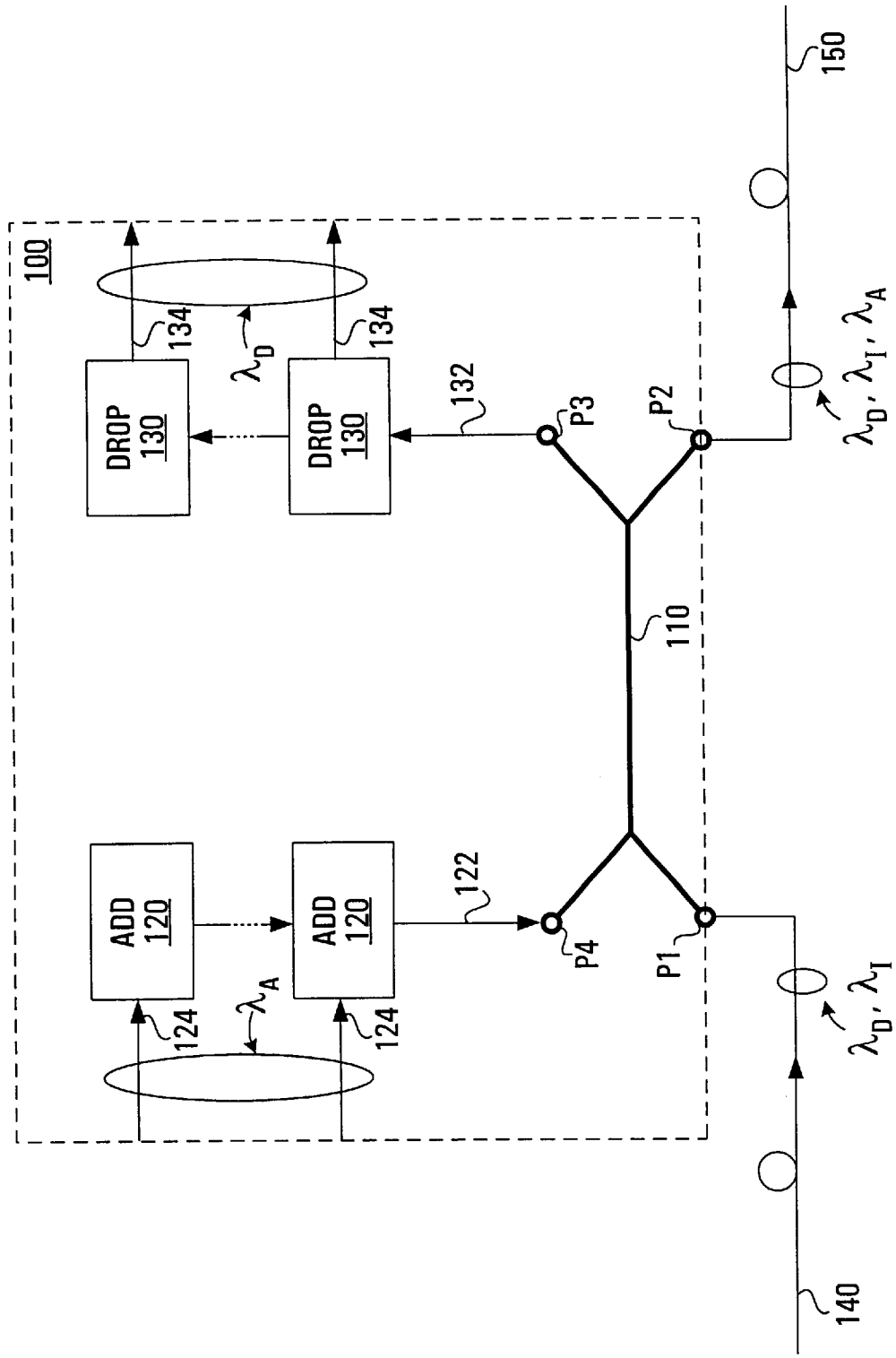
FIG. 1 shows in schematic form a node in accordance with a first preferred embodiment of the present invention.

With reference to FIG. 1, there is shown an add/drop node 100 in accordance with the first preferred embodiment of the present invention. The node 100 comprises a broadband optical coupler 110 having four ports P1,P2,P3,P4. Each port of the coupler 110 is bidirectional and therefore may serve as an input port or as an output port (or both). For the purposes of describing the add/drop node 100 of FIG. 1 more explicitly, but without any intent to limit the invention, ports P1 and P4 can be considered as input ports, while ports P2 and P3 can be considered as output ports. This reduces the node 100 to being unidirectional in the direction from west to east, i.e., from left to right in the orientation of FIG. 1. It should be understood that the coupler 110 can be designed to have more input ports and/or more output ports.

The broadband coupler 110 is a passive optical device which is characterized by a through loss and a branch loss. Given an intensity of light present at (input) port P1, the through loss (in dB) may be defined as ten times the negative logarithm of the relative amount of optical power leaving through (output) port P2, while the branch loss may be defined as ten times the negative logarithm of the relative amount of optical power leaving through (output) port P3.

Equivalently, given an intensity of light present at (input) port P4, the through loss equals ten times the negative logarithm of the relative amount of optical power leaving through (output) port P3, while the branch loss equals ten times the negative logarithm of the relative amount of optical power leaving through (output) port P2. It follows that the through loss will equal 0 dB when all of the power is passed through to the port directly opposite a given input port and will be infinite when none of the power is passed through to that port.

Typical values for the through loss or the branch loss include 0.58 dB, 0.97 dB, 1.25 dB, 3 dB, 6 dB, 6.99 dB and 9.03 dB. Those skilled in the art will appreciate that a coupler can be designed to have a different value for the through loss and the branch loss, while keeping in mind that the two values cannot be specified independently due to internal losses of the coupler and physical laws governing conservation of energy.

An add/drop node will typically be placed in the main fiber path of a ring network and as such, one of its input ports and one of its output ports will be connected thereto. In FIG. 1, port P1 is connected to an input main fiber segment 140 carrying optical channels at wavelengths in groups identified by $\lambda_D$ and $\lambda_I$, while port P2 is optically connected to an output main fiber segment 150 also carrying optical channels on wavelengths in groups $\lambda_D$ and $\lambda_I$. In addition, the output main fiber segment 150 also carries optical channels on wavelengths in a group of wavelengths identified by $\lambda_A$.

The additional optical channels on wavelengths in group $\lambda_A$ are added by the node 100, preferably by means of a cascade of add filters 120 shown optically connected to port P4 of the coupler 110 by an optical add segment 122. The add filters are preferably narrowband optical filters. The add wavelengths could be combined by other means as well, e.g., a tree of broadband couplers. Alternatively, a multiplexer may be used instead of the cascade of add filters 120 when adding multiple optical channels at the node 100. The add filters 120 are connectable to customer premises equipment by respective add fibers 124. Each add filter inserts one or more additional wavelengths from group $\lambda_A$ into the combined optical signal delivered to port P4 along the add segment 122. The finite branch loss of the coupler 110 allows the additional optical channels arriving at port P4 to be partly transferred to the main output fiber segment 150 connected to port P2.

Also due to the finite branch loss of the coupler 110, the optical signal arriving at port P1 of the coupler 110 along the input main fiber segment 140 will be partly transmitted to port P3. In order to permit the delivery of selected optical channels to customer premises equipment or other components external to the ring, port P3 is optically connected to a cascade arrangement of optical drop filters 130 via an optical drop segment 132. Each drop filter is preferably a narrowband optical filters, although a demultiplexer or a tree of couplers may be used instead of the cascade of drop filters 130 for the purpose of dropping multiple optical channels. Each drop filter 130 isolates one wavelength from the group $\lambda_D$ and sends the corresponding optical channel to customer premises equipment along a respective drop fiber 134. The channels occupying wavelengths in group $\lambda_I$ are intended for other nodes in the ring and therefore are not dropped by the drop filters 130.

As noted above, the finite branch loss of the coupler 110 allows the optical channels on wavelengths in group $\lambda_A$ to appear on the main output fiber segment 150 connected to port P2. Furthermore, the finite through loss of the coupler 110 also allows the optical channels in groups $\lambda_D$ and $\lambda_I$, present on the main input fiber segment 140, to emerge on the main output fiber segment 150. Therefore, the optical channels carried by the main output fiber segment 150 occupy wavelengths in groups $\lambda_D$, $\lambda_I$ and $\lambda_A$.

Thus, when allocating wavelengths to be used by the various nodes in a ring, i.e., when creating the "wavelength plan", it is important to consider that optical channels which are dropped by the add/drop node 100 nevertheless continue to circulate around the ring. This can be advantageous from the point of view of providing broadcasting and multicasting functionality in tandem with point-to-point communications between nodes in the ring.

Another effect of the finite through loss of the coupler 110 is that the added optical channels (occupying wavelengths in group $\lambda_A$ and which arrive at port P4 along the add segment 122) will appear at port P3 and will enter the series of drop filters 130 via drop segment 132. Therefore, to prevent interference, it is preferable to maintain good optical isolation between the pass bands of the drop filters 130 and the pass bands of the add filters 120. This can be achieved by keeping the wavelengths in group $\lambda_A$ spectrally distant from the dropped wavelengths in group $\lambda_D$ and/or by using good quality optical filters.

Figure 2:
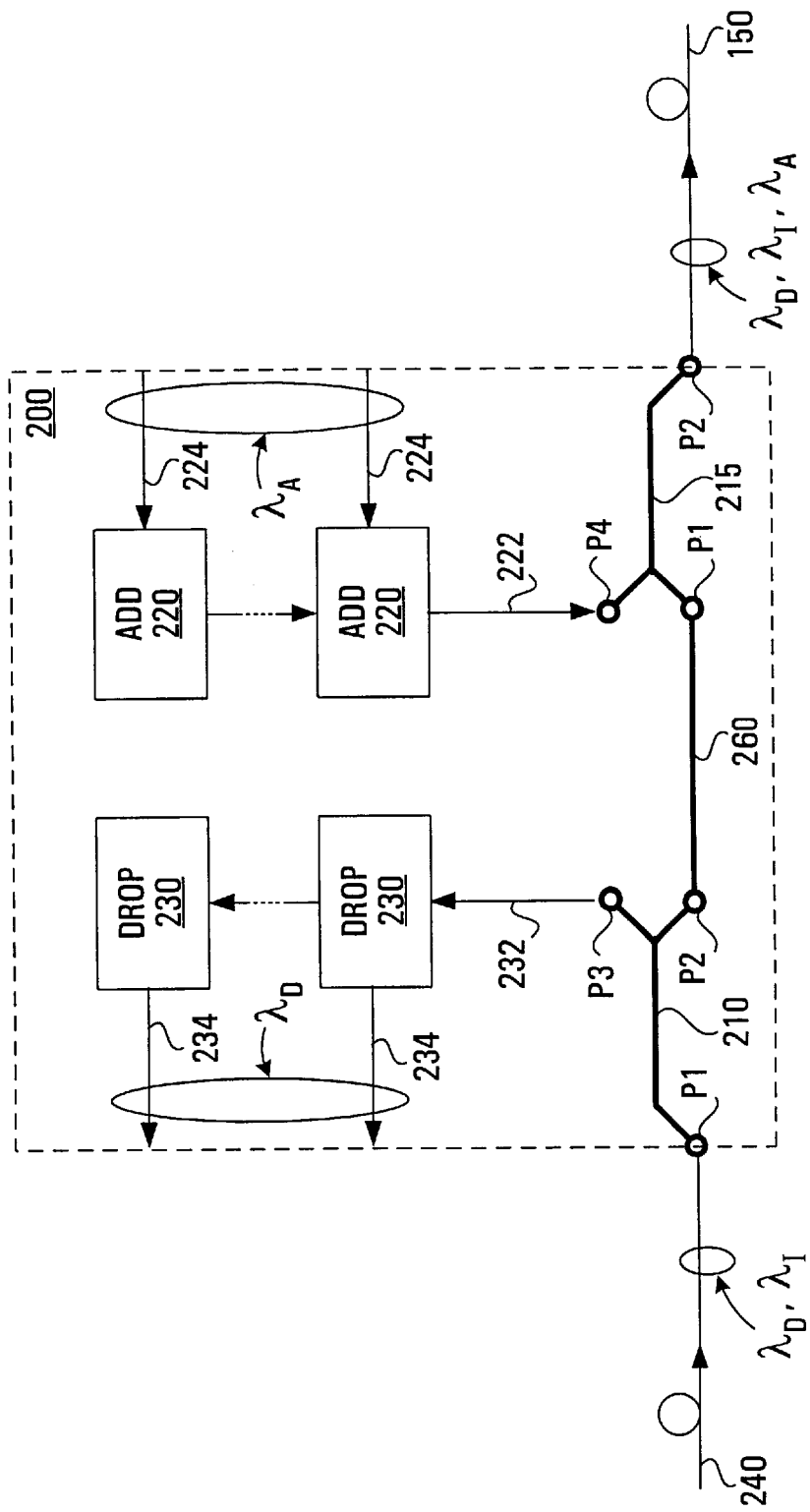
FIG. 2 shows in schematic form a node in accordance with a second preferred embodiment of the invention.

When a sufficient level of isolation is not attainable or when it is desired to maintain a low through loss around the ring while allowing channels to be added without causing interference as a result of the low through loss, the node can be redesigned to include two couplers, wherein the addition of optical channels occurs after, rather than before, dropping. To this end, FIG. 2 shows a node 200 in accordance with the second preferred embodiment of the present invention. The node 200 is unidirectional and comprises two broadband optical couplers 210, 215. Coupler 210 has a set of three ports P1, P2, P3, while coupler 215 has a set of three ports P1, P2, P4. An input main fiber segment 240 is connected to (input) port P1 of coupler 210 and an output main fiber segment 250 is connected to (output) port P2 of coupler 250. (Output) port P2 of coupler 210 is optically connected to (input) port P1 of coupler 215 by an intermediate fiber segment 260.

A cascade of drop filters 230 is optically connected to (output) port P3 of coupler 210 via a drop segment 232. The drop filters 230 are connectable to other optical equipment at the customer premises by respective drop fibers 234. Each drop filter 230 isolates a respective optical channel having a wavelength in the group $\lambda_D$. Similarly, a cascade of add filters 220 accepts optical channels arriving on respective add fibers 234 which occupy respective wavelengths in the group $\lambda_A$. The last in the series of add filters 220 is connected to (input) port P4 of coupler 215 by an add segment 222.

By using two couplers instead of one, the add/drop node 200 in FIG. 2 differs from the node of FIG. 1 in two main respects. Firstly, the branch loss of coupler 210 and the through loss of coupler 215 can be specified independently, thereby increasing the design flexibility. Second, requirements governing the sharpness of the drop filters 230 can be relaxed, as the wavelengths in group $\lambda_A$ to be added by the add filters 220 are inserted only after the drop filters 230 have dropped the desired optical channels occupying the wavelengths in group $\lambda_D$.

Those skilled in the art will appreciate that despite being called an "add/drop" node, node 100 or node 200 may be used exclusively for adding or exclusively for dropping optical channels, in which case only the add filters or only the drop filters would be required, as appropriate. Furthermore, the node may be used to add (or drop) a single wavelength or a narrow band of optical frequencies, in which case a single add (or drop) filter could be used.

Figure 3:
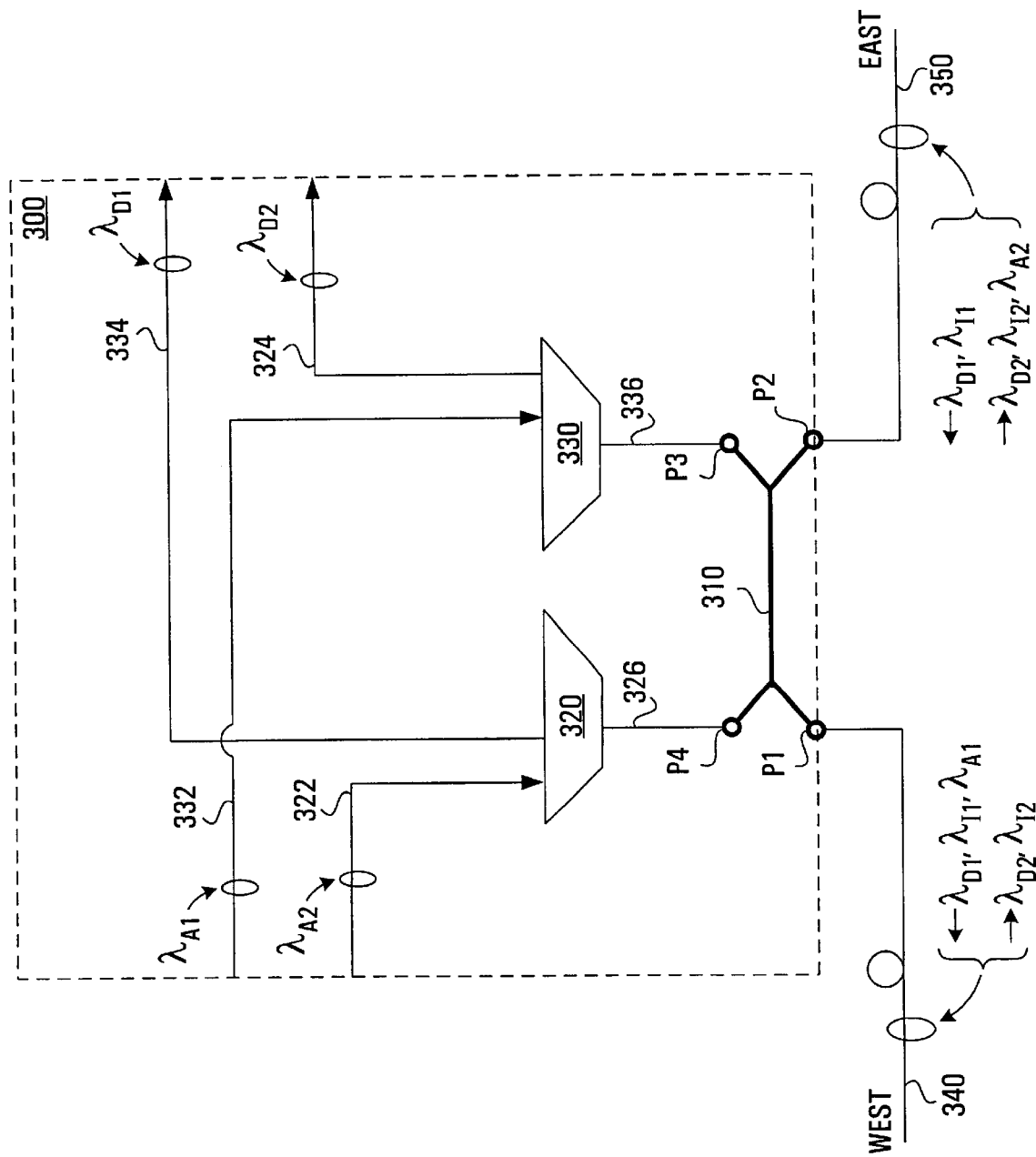
FIG. 3 shows in schematic form a node in accordance with a third preferred embodiment of the invention.

Although the above description has dealt primarily with unidirectional nodes, it will be appreciated that the invention is also applicable to bidirectional nodes. By way of example, FIG. 3 shows a node 300 in accordance with the third preferred embodiment of the present invention. Node 300 is bidirectional and comprises a broadband coupler 310 with four bidirectional ports P1, P2, P3 and P4. Ports P1 and P2 are connected, respectively, to first and second bidirectional main fiber segments 340,350. In the "eastward" incoming direction, main fiber segment 340 carries optical channels on wavelengths in sets $\lambda_{D2}$ and $\lambda_{I2}$ while in the "westward" incoming direction, main fiber segment 350 carries optical channels on wavelengths in sets $\lambda_{D1}$ and $\lambda_{I1}$.

Ports P3,P4 are connected to respective bidirectional mux/demuxes 330,320 via respective optical fiber segments 336,326. Because of the finite through loss and finite branch loss of the coupler 310, optical channels on wavelengths in sets $\lambda_{I2}$ and $\lambda_{D2}$ and arriving at port P1 along main fiber segment 340 will be delivered to port P3 (connected to mux/demux 330) and port P2 (connected to main fiber segment 350). Similarly, optical channels on wavelengths in sets $\lambda_{I1}$ and $\lambda_{D1}$ arriving at port P2 along main fiber segment 350 will reach port P4 (connected to mux/demux 320) and port P1 (connected to main fiber segment 340).

At the mux/demux 330, only those optical channels in the set $\lambda_{D2}$ are isolated, while those occupying wavelengths in the set $\lambda_{I2}$ are assumed to be destined for other nodes in the network and as such are not isolated by the mux/demux 330. The isolated channels occupying wavelengths in the set $\lambda_{D2}$ are sent to customer premises equipment along drop fiber 324. Similarly, mux/demux 320 isolates only those optical channels in the set $\lambda_{D1}$ and sends them to customer premises equipment along drop fiber.

In addition, mux/demux 330 serves to add channels on wavelengths in set $\lambda_{A1}$, as received from customer premises equipment along add segment 332. Therefore, the optical signal travelling westward out of port P1 along main fiber segment 340 occupies wavelengths in the sets $\lambda_{A1}$, $\lambda_{D1}$ and $\lambda_{I1}$. Analogously, the eastward-bound optical signal emerging on main fiber segment 350 connected to port P2 contains optical channels on wavelengths in the sets $\lambda_{A2}$, $\lambda_{D2}$ and $\lambda_{I2}$.

Figure 4:
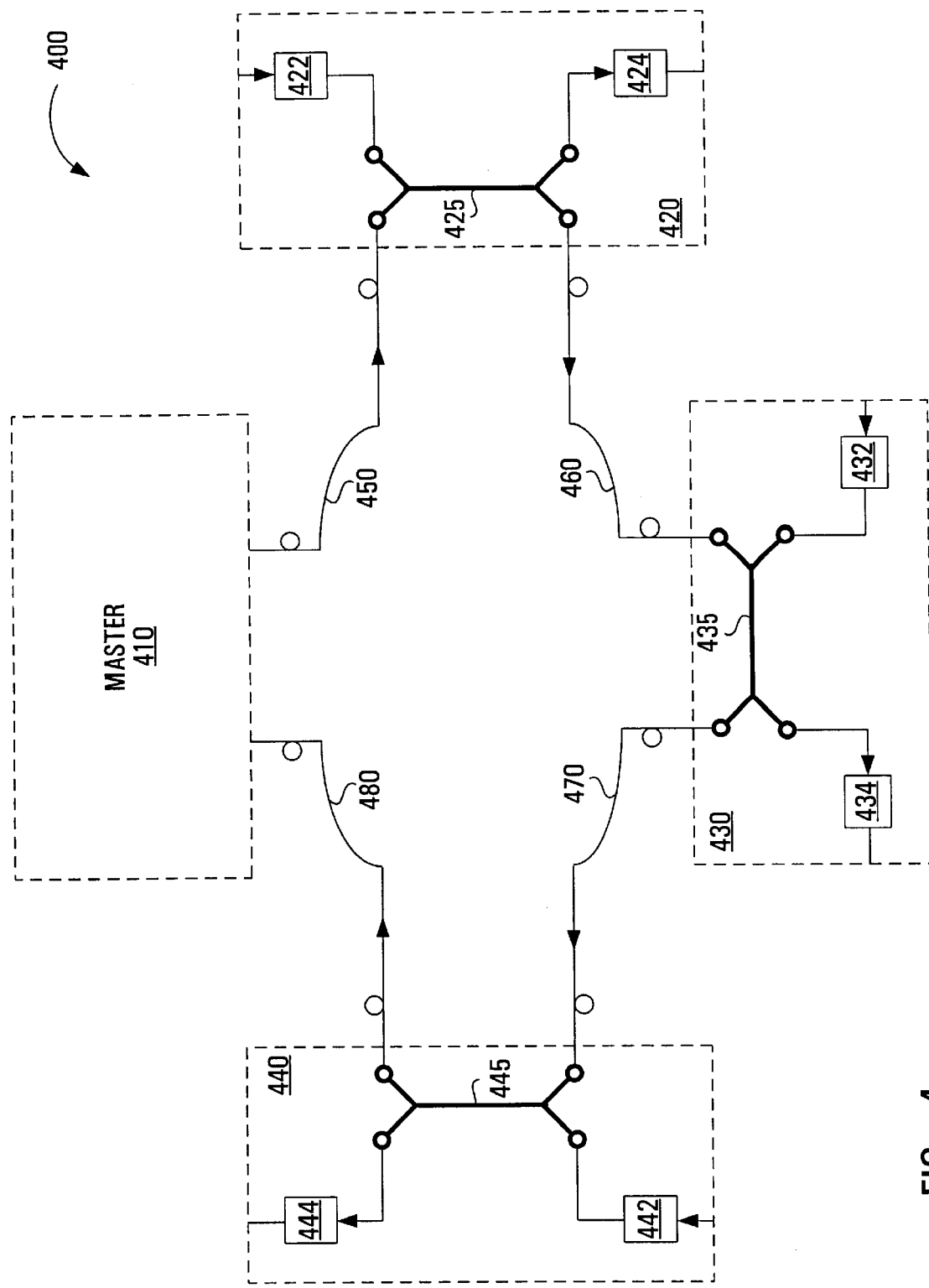
FIG. 4 shows in schematic form a ring network employing nodes of the type shown in FIG. 1.

Reference is now made to FIG. 4, which shows a network topology employing nodes of the type previously described with reference to FIG. 1. Specifically, network 400 is a ring network consisting of a master node 410 linked to a plurality of inventive add/drop nodes 420,430,440 by unidirectional optical fiber spans 450,460,470,480. Specifically, the main node 410 is connected to node 420 by fiber span 450, node 420 is further connected to node 430 by fiber span 460, node 430 is further connected to node 440 by fiber span 470, and node 440 is connected to the master node 410 by fiber 480. The master node 410 may provide a gateway to another network or it may be comprise a network server containing information to be supplied to, or collected from, nodes 420, 430 and 440. The master node 410 could be implemented as an add/drop node of the type shown in FIGS. 1 or 2. Alternatively, the master node 410 may be implemented as a full add/drop multiplexer.

Each of the nodes 420, 430 and 440 is assumed to be capable of adding and dropping optical channels. For this purpose, nodes 420, 430 and 440 are equipped with respective couplers 425, 435 and 445, to which are connected respective arrangements of add filters 424, 434 and 444 and respective arrangements of drop filters 422, 432 and 442. It should be understood that in some situations, such as in a pure broadcast scenario or a sensor array hooked up in a LAN, it may be advantageous to have some or all of the nodes 420, 430 and 440 perform only adding or only dropping of selected wavelengths.

Because both the through loss and the branch loss of the couplers 425, 435, 445 is typically finite, it is possible to transmit broadcast data from the master node 410 to all the other nodes while maintaining individual point-to-point links between the master node and selected nodes. Furthermore, nodes equipped with the capability to add optical channels allow for the transmittal of information (e.g., Web browsing commands or telephone conversations) from these nodes back to the master node. In such a situation, a wavelength plan can be devised whereby the available wavelengths are distributed among the broadcast channels, point-to-point forward channels and point-to-point return channels. It is at this stage that isolation requirements of the filter arrangements can be satisfied in part by selecting appropriately distant wavelengths.

Once an initial wavelength plan has been devised, an unforeseen change in the wavelength plan requires only the replacement of the add filters, drop filters, multiplexers or demultiplexers at the nodes of the network 400 in FIG. 4. Since replacement of the broadband couplers is not required, optical data can continue to flow along the main optical path through each node and through the network as a whole.

In some applications, especially those involving distantly spaced nodes, the effects of fiber loss and coupler loss at each node can significantly affect the quality of an optical signal as it propagates around the ring from source to destination. In order to maintain signal integrity around the ring and at each node, it may be necessary to insert amplifiers within the nodes or at strategic points within the network.

Figure 5A:
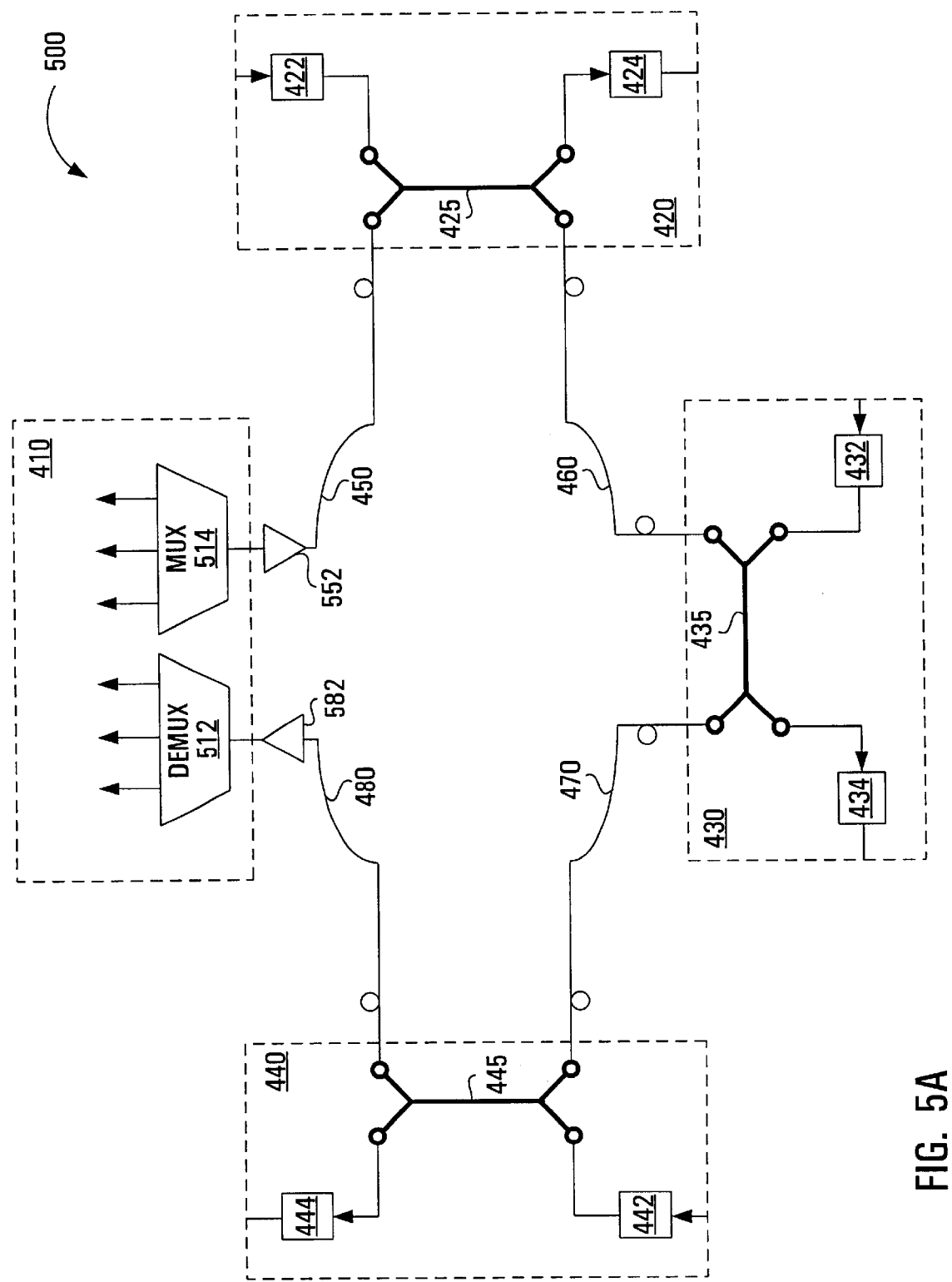
FIG. 5A shows schematically a ring network utilizing nodes of the type shown in FIG. 1 along with a pair of strategically positioned amplifiers.

By way of example, FIG. 5A shows another ring network 500 utilizing nodes of the type described earlier with reference to FIG. 1. The network 500 of FIGURE 5A differs from the network 400 of FIG. 4 in that the master node 410 is shown more explicitly as comprising a demultiplexer 512 and a multiplexer 514. Even more significantly, the demultiplexer 512 interfaces with fiber segment 480 via a preamplifier 582, while the multiplexer 514 interfaces with fiber segment 450 via a post-amplifier 552. This configuration is relatively simple, requiring only two amplifiers for the entire ring, regardless of the number of nodes attached thereto. Due to this limited maximum number of amplifiers through which an optical signal will pass on its way from source to destination, the amplifiers 552,582 need not be wavelength flat. However, the system designer should be aware that the through loss of the coupler in each node causes a decrease in the received optical intensity from one node to the next as the signal travels around the ring. This may limit the number of nodes that can be connected in the manner shown in FIG. 5A.

Figure 5B:
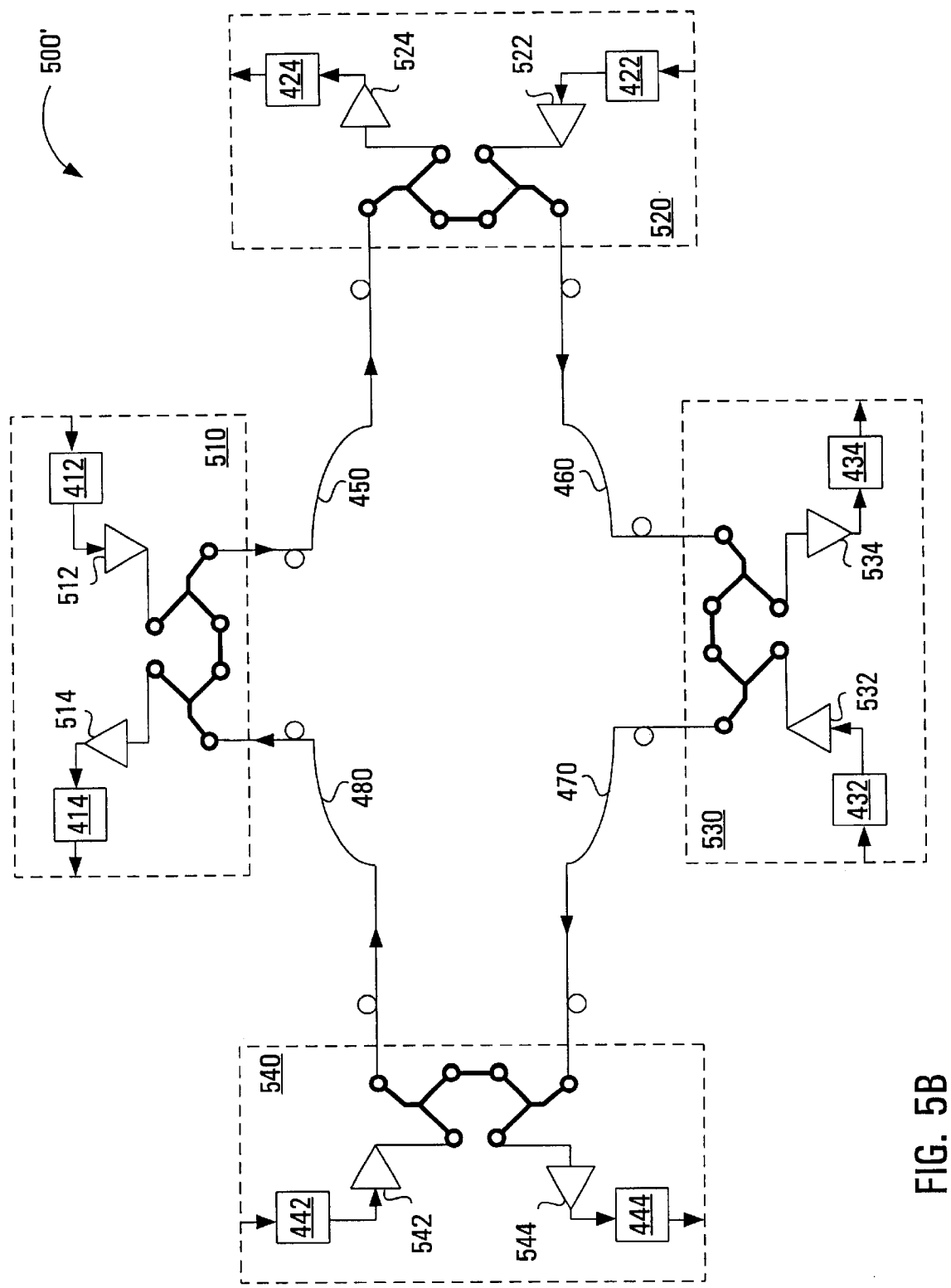
FIG. 5B shows schematically a ring network utilizing nodes constructed in accordance with a fourth preferred embodiment of the present invention.

FIG. 5B shows a network 500' comprising a plurality of nodes 510, 520, 530, 540 constructed in accordance with the fourth preferred embodiment of the present invention. Node 510 is connected to node 520 by fiber segment 450, node 520 is further connected to node 530 by fiber segment 460, node 530 is further connected to node 540 by fiber segment 470 and node 540 is connected to node 510 by fiber segment 480.

Nodes 510, 520, 530, 540 are similar to those described earlier with reference to FIG. 2, each having a pair of three-port couplers, a respective cascade of add filters 412, 422, 432, 442 and a respective cascade of drop filters 414, 424, 434, 444. In addition, each node 510, 520, 530, 540 comprises a respective add amplifier 512, 522, 532, 542 placed at the output of the respective cascade of add filters and a respective drop amplifier 514, 524, 534, 544 placed at the input to the respective cascade of drop filters.

The add and drop amplifiers compensate for the branch loss of the couplers, thereby increasing the maximum possible ring size. Also, the add and drop amplifiers need not be significantly wavelength-flat, since an optical signal travelling from a source node to the drop path of a destination node (or from the add path of a source node to a destination node) will not pass through more than a total of two amplifiers. Moreover, add amplifiers 512, 522, 532, 542 see only a limited number of wavelengths and thus require less output power than the amplifiers in FIG. 5A.

Figure 5C:
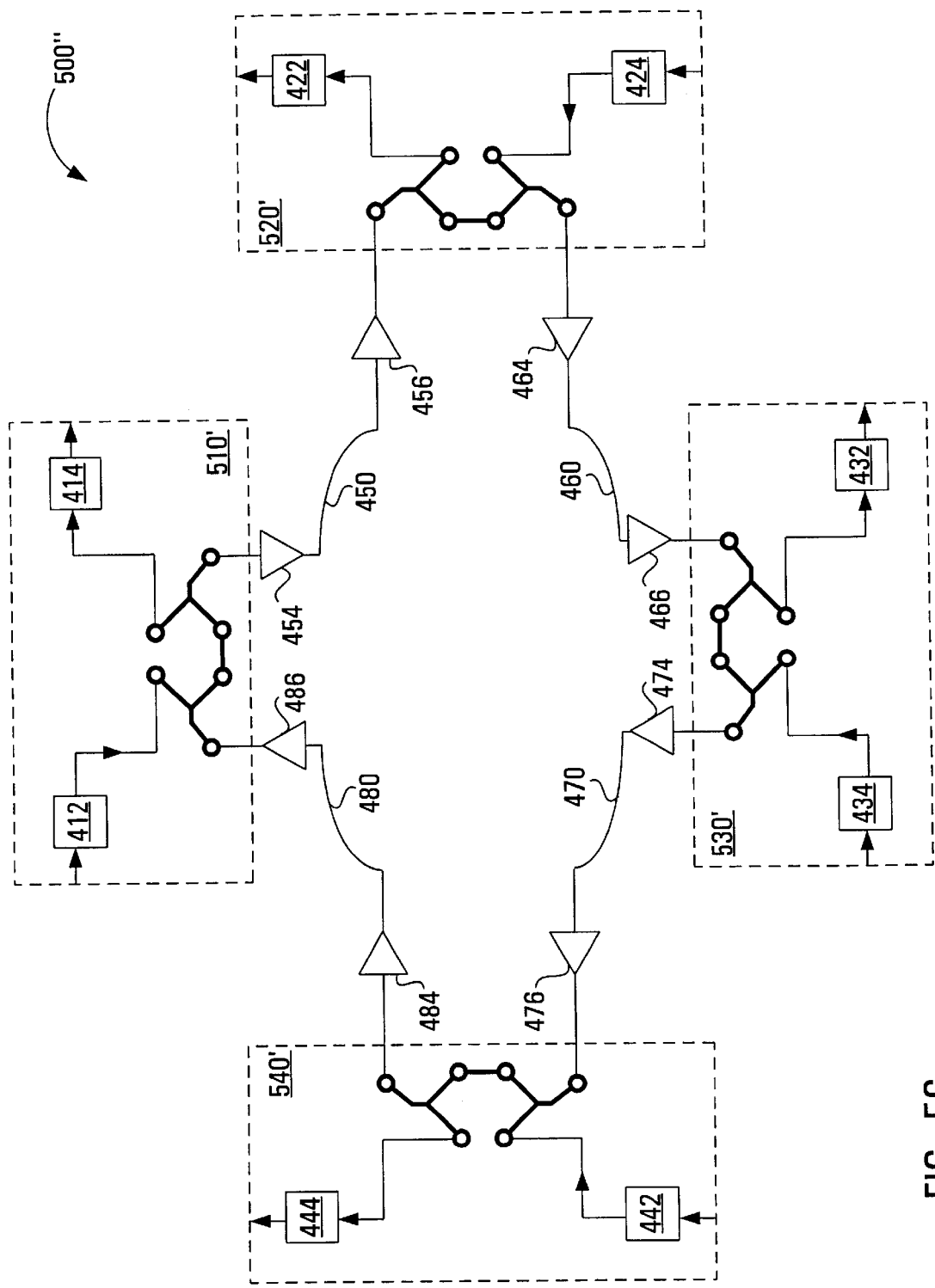
FIG. 5C shows schematically a ring network utilizing nodes of the type shown in FIG. 2 along with a plurality of strategically placed amplifiers.

In FIG. 5C is shown a network 500" comprising a plurality of nodes 510', 520', 530', 540' of the type described earlier with reference to FIG. 2. Node 510' is connected to node 520' by fiber segment 450 intercepted by a post-amplifier 454 at the output of node 510' and by a preamplifier 456 at the input to node 520', respectively. Similarly, fiber segments 460, 470, 480 respectively linking nodes 520', 530', 540' to nodes 530' 540', 510' are each connected to a respective post-amplifier 464, 474, 484 and a respective pre-amplifier 466, 476, 486. In this configuration, performance is best when couplers with a high through loss and a low branch loss are used, the high through loss being compensated by the pre-amplifiers and the post-amplifiers.

Of course, one can envisage a system in which only the pre-amplifiers or only the post-amplifiers are present. Furthermore, the pre-amplifiers or post-amplifiers could in fact form part of the corresponding node. In any event, the amplifiers used should be wavelength-flat, as an optical signal circulating around the ring will necessarily pass through a number of amplifiers dependent on the number of nodes between source and destination.

In a ring network employing broadband couplers, such as the ring networks of FIGS. 4, 5A, 5B and 5C, optical channels that are dropped are not removed from circulation around the ring. It is therefore of paramount importance to ensure that signals (and noise) which circulate perpetually around the ring are not excessively amplified. There are several ways to limit the effects of such positive feedback and coherent crosstalk in a ring network.

For hubbed traffic patterns, a full add/drop mux/demux (ADM) can be placed at the hub node. This breaks the ring and prevents recirculation of noise and unwanted signals. Such breaking of the ring can be successfully applied to the networks of the type shown in FIG. 5A.

In the absence of an ADM or when the installation of an ADM is undesirable or inconvenient, e.g., in meshed traffic patterns, the effects of positive feedback and coherent crosstalk around a ring comprising nodes equipped with broadband couplers can be limited by ensuring that a recirculating signal undergoes a certain net round-trip loss. For the configuration in FIG. 5B but without a break in the ring, this can be achieved simply by adding loss to the ring until the target loss is met since there is no amplification on the common path. In this case, the net round-trip loss should be large enough to prevent the onset of positive feedback and coherent crosstalk but should be sufficiently small to allow detection of optical signals to occur with a certain acceptable bit error rate (BER). An empirical value for an acceptable round-trip loss has been found to be 20 dB at any given wavelength, but it is to be understood that different values may be arrived at by other skilled engineers in the field of optical networking.

For the configuration in FIG. 5C, it is possible to reach a predetermined round-trip loss target in various ways, two of which are now described. Both of the following analyses will consider a network similar to that of FIG. 5C but with the post-amplifiers removed, and generalized to an arbitrary number of nodes. Each remaining pre-amplifier is assumed to operate in gain clamp mode, which means that it will strive to achieve a certain assigned gain by varying its output optical power as a function of its input optical power. Each node is assumed to have a respective through loss and a respective branch loss associated with the corresponding coupler(s), while each fiber span is assumed to have a respective fiber loss.

According to a first method of gain control, the gain of each pre-amplifier is initially set to equal the known through loss of the coupler(s) of the node to which its output is connected. In this way, a signal suffers no net loss as it travels through a pre-amplifier/node combination. The net loss around the ring is therefore given by the sum of the fiber losses. The individual gain of each pre-amplifier may be adjusted if the total fiber loss does not meet the round-trip loss target.

This just described method provides satisfactory performance when the fiber spans are substantially equal in length and when the net fiber loss is known. However, it is clear that in a configurations where different fiber lengths are employed, the signal received at a given node will have a strength that is dependent on the fiber distance between it and the source node rather than on the position of that node in the ring. When it is desirable to distribute the loss around the ring evenly for each span, then the following approach may be more appropriate.

For this alternative method of gain control to function as intended, the nodes are assumed to communicate control information, possibly over a reserved optical service channel. Each pre-amplifier operates in gain clamp mode and has a variable gain, the gain being controlled from the corresponding node by a processing unit, such as a digital signal processor or micro-controller, located in the node. Each node is additionally equipped with circuitry for measuring the optical power level at the input to the respective pre-amplifier. For the purposes of communicating control information, each node is also equipped with encoding and decoding circuitry connected to the coupler and to the processing unit.

A fixed round-trip loss target $T_{ROUND\_TRIP}$ is chosen which mitigates the effects of positive feedback and coherent crosstalk but continues to provide acceptable BER performance. The round-trip loss target $T_{ROUND\_TRIP}$ is part of the control information sent to each node at setup time. It can be assumed that the number N of nodes in the ring is known. (Otherwise, it can be calculated, for example, by a first node transmitting a token which is incremented by one as it passes through each node. Upon return of the token, the first node knows the number of nodes in the ring and distributes this control information to the other nodes.) Furthermore, it is assumed that a previous node, i.e., the node from which a current node obtains control information, is capable of sending a calculated value of its output power level to the current node.

Figure 7:
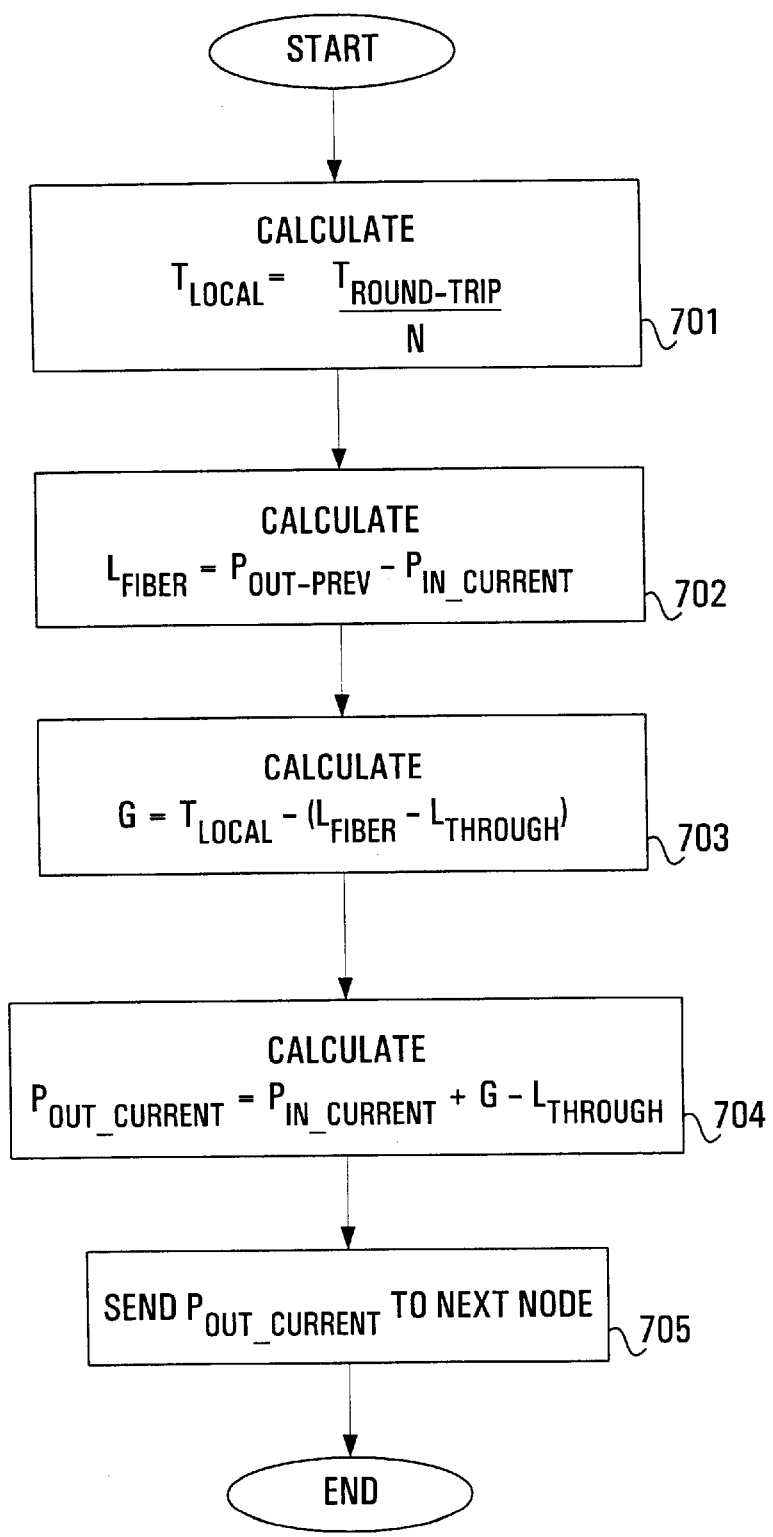
FIG. 7 is a flowchart showing a method of setting amplifier gain in the network of FIG. 5C according to an embodiment of the invention.

The procedure to be followed by the processor in each node is now described with reference to FIG. 7. At step 701, the current node divides the round-trip loss target $T_{ROUND\_TRIP}$ by the number of nodes N, thereby to compute a "local" loss target $T_{LOCAL}$ which is to be met by the pre-amplifier and coupler(s) associated with the current node. Clearly, due to the common division of the round-trip loss-target by N, the local loss target $T_{LOCAL}$ is common to all nodes and may in fact form part of the control information initially provided to each node.

Next, the current node measures the power level $P_{IN\_CURRENT}$ at the input to the respective pre-amplifier, which is then subtracted, at step 702, from the value of the output power level $P_{OUT\_PREV}$ sent by the previous node in order to determine the fiber loss $L_{FIBER}$. To the fiber loss $L_{FIBER}$ is added the known through loss $L_{THROUGH}$ of the coupler and the total is subtracted from the local loss target $T_{LOCAL}$ at step 703. The result G is thus the gain (or attenuation) to be applied by the pre-amplifier in order that the pre-amplifier and coupler meet the local loss target $T_{LOCAL}$. At step 704 the value of the output power level $P_{OUT\_CURRENT}$ is calculated, i.e., estimated, as being the sum of the input power $P_{IN\_CURRENT}$ to the pre-amplifier, the gain G of the pre-amplifier and the negative of the through loss of the node $(-L_{THROUGH})$.

Finally, at step 705, the output power level $P_{OUT\_CURRENT}$ computed at step 704 is communicated to the next node where the same process is repeated for that node and so on for all the nodes in the ring. Alternatively, this calculation can be performed by a central processor or operator and the results communicated back to the respective amplifier. Of course, each node may perform its own gain adjustment in parallel with all other nodes instead of performing the computation sequentially on a node-by-node basis. It will also be appreciated by those skilled in the art that the output power level could be measured (rather than computed) in which case the nodes would need to be equipped with the appropriate circuitry.

It should be understood that a similar procedure to that just described would be applied in a configuration having post-amplifiers positioned after the coupler in each node.

Figure 6:
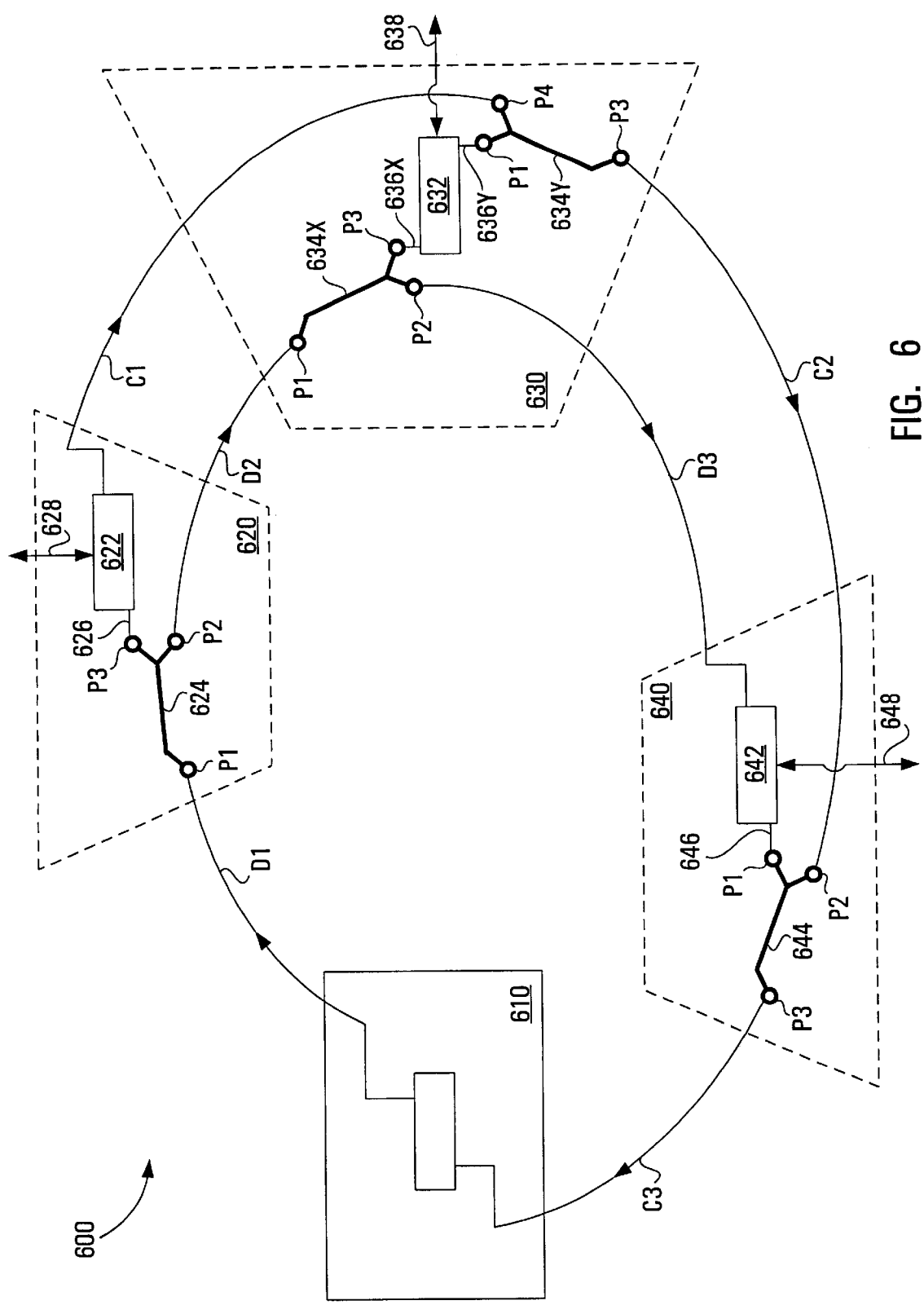
FIG. 6 shows in schematic form a ring network employing nodes constructed in accordance with a fifth preferred embodiment of the present invention.

FIG. 6 shows an alternate network arrangement 600 that has all the benefits of the previous configuration and, in addition, provides the main advantage that an increased loss is available to be assigned to the fiber. Furthermore, this configuration allows for either larger ring distances or lower equipment costs. As shown in FIG. 6 a hub (or master) node 610 is linked to three add/drop nodes 620, 630, 640 in a dual-fiber configuration. The hub node 610 may comprise an add/drop multiplexer connected to another ring or it may simply be an add/drop node designated as the "master".

The hub node 610 and the add/drop nodes 620, 630, 640 are interconnected by a drop path consisting of drop fiber segments D1,D2,D3 and a collect path consisting of collect fiber segments C1,C2,C3. The drop path terminates with drop fiber segment D3 at node 640 and distributes optical traffic originating at the hub node 610 among the various other nodes in the ring, while the collect path starts with collect fiber segment C1 at node 620 and accumulates traffic from the various nodes and delivers it to the hub node 610.

The nodes 620, 630, 640 are structured according to a fifth preferred embodiment of the present invention. Node 620 comprises a processing block 622 (containing equipment which may include add filters, drop filters, multiplexers, demultiplexers and opto-electronic converters) as well as a broadband optical coupler 624 having three ports P1, P2 and P3. Port P1 is connected to drop fiber segment D1, port P2 is connected to drop fiber segment D2 and port P3 is connected to the processing block 622 via an intermediate fiber segment 626. The finite through loss of the coupler 624 allows the incoming ring traffic arriving on drop segment D1 to be forwarded along drop segment D2. In addition, the finite branch loss of the coupler 624 allows this incoming ring traffic to be forwarded to the processing block 622, where operations such as demultiplexing and opto-electronic conversion may be performed. Incoming ring traffic is then forwarded by the processing block 622 to the customer premises via a link 628, which may be optical, wireline or wireless. In the opposite direction, traffic received from the customer premises via link 628 is forwarded onto collect fiber segment C1 for delivery to the hub node 610 via nodes 630 and 640.

Node 630 comprises a processing block 632 in addition to two broadband optical couplers 634X, Y. Coupler 634X has ports P1, P2 and P3, while coupler 634Y has ports P1, P3 and P4. Port P1 of coupler 634X is connected to drop fiber segment D1, port P2 is connected to drop fiber segment D3 and port P3 is connected to the processing block 632 via an intermediate fiber segment 636X. Coupler 634Y has port P4 connected to collect fiber segment C1, port P3 connected to collect fiber segment C2 and port P1 connected to the processing block 632 via an intermediate fiber segment 634Y.

Traffic arriving from the hub node 610 via node 620 along drop fiber segment D2 passes through coupler 634X and is split between intermediate fiber segment 636X and drop fiber segment D3. The channels destined for node 630 are isolated by the processing block 632 connected to intermediate fiber segment 636X and are forwarded to the customer premises via a link 638. In the opposite direction, the processing block 632 receives traffic from the customer premises via link 638 and then multiplexes the traffic onto an optical signal provided to port P1 of coupler 634Y along intermediate fiber segment 636Y. The finite through and branch losses of coupler 634Y allow the optical signal on intermediate fiber segment 636Y and on collect fiber segment C1 to be merged as they appear on collect fiber segment C2 connected to port P3 of coupler 634Y.

Node N3 comprises a processing block 642 and a broadband optical coupler 644 with ports PI, P2 and P3. Port P1 of coupler 644 is connected to collect fiber segment C2, port P2 is connected to the hub node 610 via collect fiber segment C3 and port P3 is connected to the processing block 642 via an intermediate fiber segment 646. The channels on drop fiber segment D3 which are destined for node 640 are isolated by filtering or demultiplexing equipment in the processing block 642. The isolated channels are delivered to the customer premises by the processing block 642 along a bidirectional link 648. Since node 640 is the last node in the ring from the point of view of hub node transmissions, drop fiber segment D3 represents the final drop fiber segment in the drop path.

The processing block 642 also accepts channels arriving from the customer premises via link 648 and these are multiplexed onto an optical signal delivered to port P1 of coupler 644 along intermediate fiber segment 646. By virtue of the finite through loss and branch loss of the coupler 644, the channels arriving on collect fiber segment C2 are combined with those arriving on intermediate fiber segment 646 and the combined optical signal emerges at port P3, which is connected to the hub node 610 by collect fiber segment C3.

Ideally, a digital optical signal transmitted by the hub node 610 across drop fiber segment D1 and destined for all nodes should be received with a substantially equal probability of error at each node. Assuming that couplers 624 and 634X in nodes 620 and 630 are identical, i.e., have identical through and branch losses, the receiver sensitivity required of the processing block 642 at node 640 would have to be much higher than the required receiver sensitivity of a receiver forming part of the processing block 632 at node 630, which, in turn, would have to be much higher than the required sensitivity of a receiver in the processing block 622 of node 620.

In such a situation, the dynamic range of the various receivers would have to be different, which reduces the design flexibility. Stated differently, if design flexibility cannot be compromised, the system cost is increased since the dynamic range of a generic receiver usable at each node would have to be such that each individual optical signal is received with substantially the same probability of error.

However, one of the characteristics of using broadband coupler-based nodes arranged in accordance with FIG. 6 is the freedom to design for a variable through loss and branch loss of the broadband couplers 624, 634X (while keeping in mind that the two quantities cannot be specified independently.) Specifically, the through loss of upstream couplers is reduced in order to advantageously increase the loss available to be assigned to the fiber.

Furthermore, by working backwards from a desired signal level to be received at node 640 from drop fiber segment D3, and given the value of the fiber loss across each drop fiber segment, it is possible to find a pair of values for the through loss and branch loss of each coupler and a value for the initial transmitted intensity at the hub node which will yield substantially the same received intensity at each node. Advantageously, this will result in a substantially equal probability of correctly receiving the original digital signal.

A similar scenario arises when considering the collect path. In this case, it is desirable for the hub node 610 to receive the signals transmitted from nodes 620, 630, 640 across collect fiber segments C1, C2, C3 with substantially equal intensity. This can be achieved at each node by applying a degree of amplification to the transmitted signal which varies according to the distance of the node from the hub node.

Disadvantageously, this requires the use of transmitters having a varying dynamic range.

To overcome this disadvantage, coupler 634Y in node 630 may be designed to have a higher branch loss but a lower through loss than coupler 644 in node 640. In other words, the through loss of the upstream coupler is reduced relative to that of the downstream coupler. This allows an increase in the loss available to be assigned to the fiber and allows the signal transmitted by node 620 across collect fiber segment C1 to reach the hub node 610 with an intensity approximately equal to that of the signals transmitted by nodes 630, 640 across collect fiber segments C2, C3, respectively. Furthermore, the loss between the node most remote from the hub node and the hub node itself is reduced as no coupler is required at that node.

Yet another advantage of the configuration in FIG. 6 is that the wavelength plan may be devised separately for the drop and collect paths. In terms of capacity it is to be noted that the configuration of FIG. 6 has a per-fiber channel capacity equal to that of FIG. 4 which uses a single fiber for transmission to and from the hub (master) node. If desired, two additional fibers can be used as a protection facility. It is noted that the arrangement of FIG. 6 may also be used bidirectionally, in which case only a single fiber is required.

It is to be appreciated that still other network configurations stand to benefit from the use of inventive add/drop nodes. These include networks consisting of nodes that are prone to failure and in which it is necessary to allow other nodes in the network to take over the functions previously performed by the failed sites. This "dual-homing" capability (as it is sometimes called) is inherent to the present invention since nodes drop optical signals from the main fiber path without physically interrupting it.

Further advantages of the invention in general include improving security and reliability of optical communications between end sites separated by an intermediate site. Conventionally, main fibers carrying optical traffic between the end sites would physically pass through the intermediate site, which intermediate site could maliciously intercept communications or cause serious disruptions if it were to fail.

Figure 8:
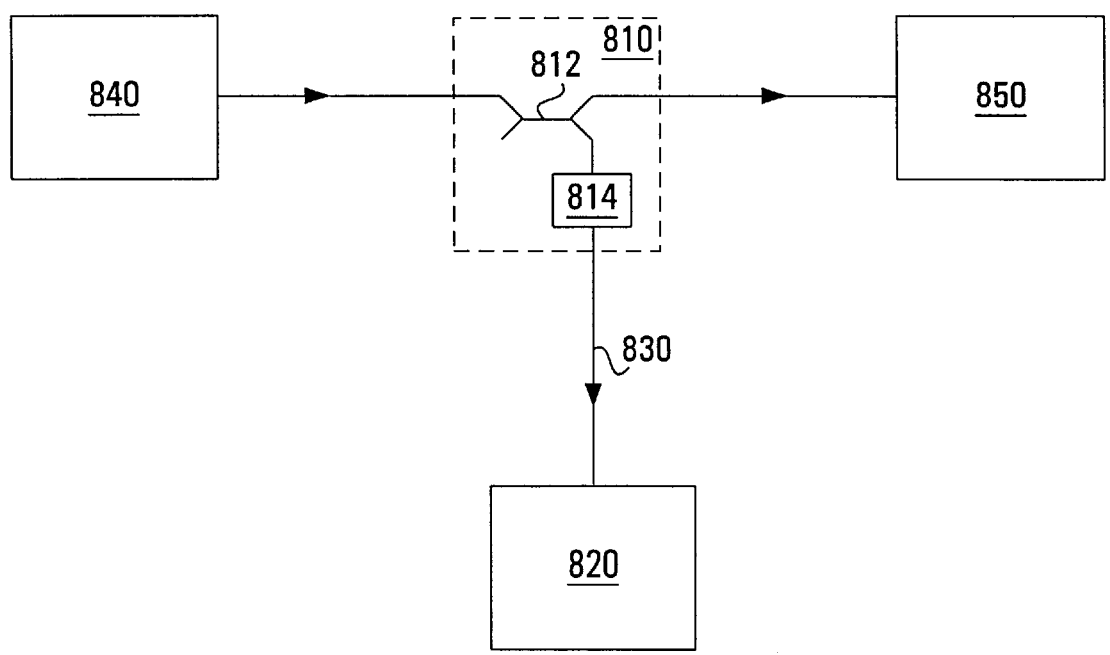
FIG. 8 shows in schematic form another embodiment of the present invention employed in a "manhole" configuration.

However, with the broadband coupler-based approach described herein, the main fibers need not pass through the intermediate site. By way of example, FIG. 8 shows use of a node in accordance with another embodiment of the present invention, consisting of a drop node 810 which could physically be located in a manhole or completely buried underground. The drop node 810 comprises a coupler 812 which is connected between two end sites 840, 850. The coupler is also connected to a remote site 820 via a channel dropping device 814 (e.g., an arrangement of drop filters or a demultiplexer) and a drop fiber 830. For security reasons, the channel dropping device 814 could be arranged to allow the drop fiber 830 to carry only a subset of the WDM optical signal travelling between the end sites 840, 850. It is also noted that reliability is improved since a failure of the intermediate site 820 causes no disruption to the communications effected between the end sites 840, 850.

While preferred embodiments of the present invention have been described and illustrated, it will be apparent to persons skilled in the art that numerous modifications and variations are possible. The scope of the invention, therefore, is only to be limited by the claims appended hereto.

We claim:

1. An optical communications node, comprising:

an optical coupling device having a first input port and a plurality of output ports, the optical coupling device being arranged such that light entering the first input port is coupled to each of the output ports; and at least one drop circuit connected to at least one of the output ports, each drop circuit being arranged to isolate a portion of the optical frequency spectrum of the optical signal present at the output port to which that drop circuit is connected.

2. A node as claimed in claim 1, wherein the optical coupling device has a finite through loss and a finite branch loss.

3. A node according to claim 2, further comprising a pre-amplifier connected to the first input port, the pre-amplifier having a gain substantially equal to the through loss of the optical coupling device.

4. A node according to claim 2, further comprising a post-amplifier connected to one of the output ports not connected to a drop circuit, the post-amplifier having a gain substantially equal to the through loss of the optical coupling device.

5. A node according to claim 2, further comprising a pre-amplifier connected to the first input port and a post-amplifier connected to one of the output ports not connected to a drop circuit, the pre-amplifier and the post-amplifier having a combined gain substantially equal to the through loss of the optical coupling device.

6. A node according to claim 1, wherein the optical coupling device further comprises a second input port, the optical coupling device being arranged such that light entering the second input port is coupled to each of the output ports, the node further comprising:

an add circuit connected to the second input port, for admitting a signal occupying a selected portion of the optical frequency spectrum;

wherein the portion of the optical frequency spectrum of the signal admitted by the add circuit is distinct from the portion of the optical frequency spectrum isolated by each drop circuit.

7. A node as claimed in claim 3, wherein the optical coupling device comprises:

first and second broadband optical couplers, each coupler having a finite through loss and a finite branch loss, the first coupler connected between the first input port and the at least one output port that is connected to a drop circuit, the second coupler connected between the second input port and at least one of the output ports not connected to a drop circuit; and an intermediate fiber segment optically connecting the first broadband optical coupler to the second broadband optical coupler.

8. A node according to claim 7, further comprising a pre-amplifier connected to the first input port, the pre-amplifier having a gain substantially equal to the combined through loss of the first and second broadband optical couplers.

9. A node according to claim 7, further comprising a post-amplifier connected to one of the output ports not connected to a drop circuit, the post-amplifier having a gain substantially equal to the combined through loss of the first and second broadband optical couplers.

10. A node according to claim 7, further comprising a pre-amplifier connected to the first input port and a post-amplifier connected to one of the output ports not connected to a drop circuit, the pre-amplifier and the post-amplifier having a combined gain substantially equal to the combined through loss of the first and second couplers.

11. A node according to claim 6, wherein the add circuit comprises an optical multiplexer.

12. A node according to claim 6, wherein the add circuit comprises at least one narrowband optical filter.

13. A node according to claim 1, wherein each drop circuit comprises a narrowband optical filter.

14. A node according to claim 1, wherein each drop circuit comprises an optical demultiplexer.

15. A fiber optic network comprising:

a plurality of nodes according to claim 1; and an optical path connecting pairs of said nodes in a ring;

wherein for each node, an output port that is not connected to a drop circuit is connected to the first input port of an adjacent node.

16. A node for use in an optical communications network, comprising:

an optical coupling device having a plurality of input ports and an output port, the optical coupling device being arranged such that light entering each of the input ports is coupled to the output port; and an add circuit connected to at least one of the input ports, for admitting a signal occupying a selected portion of the optical frequency spectrum.

17. A fiber optic network comprising:

a plurality of nodes, each according to claim 16; and an optical path connecting pairs of said nodes in a ring;

wherein for each node, an input port that is not connected to an add circuit is connected to the output port of an adjacent node.

18. A bidirectional node for use in an optical communications network, comprising:

an optical coupling device having a plurality of bidirectional first ports and a plurality of bidirectional second ports, the optical coupling device being arranged such that light entering any of the first ports is coupled to each of the second ports and light entering any of the second ports is coupled to each of the first ports; and a bidirectional optical filtering circuit connected to at least one of the first ports;

wherein at least another one of the first ports and at least one of the second ports are connectable to a main optical path and wherein wavelengths of optical signals coupled to the main optical path by the filtering circuit and the optical coupling device are selected to be substantially non-interfering with respect to wavelengths occupied by optical signals arriving at the node along the main optical path.

19. A bidirectional node as claimed in claim 18, further comprising:

a second bidirectional optical filtering circuit connected to at least another one of the second ports;

wherein wavelengths of optical signals coupled to the main optical path by the second filtering circuit and the optical coupling device are selected to be substantially non-interfering with respect to wavelengths occupied by optical signals arriving at the node along the main optical path.

20. A fiber optic network comprising:

a plurality of nodes according to claim 19; and an optical path connecting pairs of said nodes in a ring;

wherein for each pair of adjacent nodes, a second port of one node not connected to a second filtering circuit is connected to a first port of the other node not connected to a first filtering circuit.

21. A fiber optic network comprising:

a plurality of nodes according to claim 18; and an optical path connecting pairs of said nodes in a ring;

wherein for each pair of adjacent nodes, a second port of one node is connected to a first port of the other node not connected to a first filtering circuit.

22. A node for use in a fiber optic network, comprising:

a broadband optical coupler having at least one input port and a plurality of output ports, the coupler being characterized by a through loss $L_{THROUGH}$;

a unit for measuring the optical power $P_{IN\_CURRENT}$ of a multi-channel optical signal present at said input port of said coupler;

an amplification unit for amplifying said multi-channel optical signal in accordance with a gain; and a processing unit connected to the amplification unit, said processing unit being operable to receive control information comprising at least the output power level $P_{OUT\_PREV}$ of a previous node in the network and to set said gain equal to a function of $P_{OUT\_PREV}$, $P_{IN\_CURRENT}$, $L_{THROUGH}$ and a local target power level $T_{LOCAL}$.

23. A node as claimed in claim 22, wherein said function is equal to $T_{LOCAL} - (P_{OUT\_PREV} - P_{IN\_CURRENT} - L_{THROUGH})$.

24. A node as claimed in claim 22, wherein the processing unit is further operable to determine an output power level by adding $P_{IN\_CURRENT}$ to said gain and subtracting $L_{THROUGH}$ therefrom, the node further comprising:

encoding circuitry connected to one of said at least one input port of the coupler and to the processing unit, for receiving said output power level from the processing unit, encoding it and providing it to said one of the at least one input port of the coupler.

25. A node for connection between first and second adjacent nodes in a main optical traffic-carrying path, the node comprising:

a plurality of first ports and a plurality of second ports, at least one of the first ports being connectable to the first adjacent node and at least one of the second ports being connectable to the second adjacent node;

an optical coupling device arranged such that light entering any of the first ports is coupled to each of the second ports and light entering any of the second ports is coupled to each of the first ports; and a removable filtering circuit connected to at least one of the first ports not connected to the first adjacent node and at least one of the second ports not connected to the second adjacent node, the filtering circuit being adapted to add or drop specified wavelength channels to or from the main optical path.

* * * * *